(12) United States Patent
Watanabe

(10) Patent No.: US 6,670,102 B2
(45) Date of Patent: Dec. 30, 2003

(54) METHOD FOR MANUFACTURING CIRCUIT BOARD HAVING CONDUCTIVE VIA

(75) Inventor: Ryoichi Watanabe, Khoto (JP)

(73) Assignee: International Business Machines Corporation, Armonk, NY (US)

(*) Notice: Subject to any disclaimer, the term of this patent is extended or adjusted under 35 U.S.C. 154(b) by 88 days.

(21) Appl. No.: 09/978,124

(22) Filed: Oct. 15, 2001

(65) Prior Publication Data

US 2002/0045135 A1 Apr. 18, 2002

(30) Foreign Application Priority Data

Oct. 16, 2000 (JP) ......................................... 2000-314935

(51) Int. Cl.[7] ................................................ G03F 7/26
(52) U.S. Cl. ........................ 430/313; 430/316; 430/318
(58) Field of Search ................................. 430/311, 313, 430/316, 318

(56) References Cited

U.S. PATENT DOCUMENTS 5,814,889 A * 9/1998 Gaul .......................... 257/773

* cited by examiner

Primary Examiner—Kathleen Duda
(74) Attorney, Agent, or Firm—William N. Hogg

(57) ABSTRACT

A method for manufacturing a circuit board having a conductive via comprises the steps of providing a substrate having a first surface and a first conductive layer on at least one region of the first surface, forming an insulating layer on the first conductive layer, forming an opening in the insulating layer, so that the opening extending to the first conductive layer, forming a second conductive layer inside the opening and at least on the insulating layer near the opening, applying a positive photoresist on the second conductive layer, exposing the positive photoresist, developing the exposed positive photoresist, and removing the positive photoresist on the second conductive layer, except a portion of the second conductive layer that is inside the opening, etching the second conductive layer, to expose a surface of the second conductive layer, removing the positive photoresist from inside the opening, and forming a third conductive layer inside the opening.

5 Claims, 3 Drawing Sheets

METHOD FOR MANUFACTURING CIRCUIT BOARD HAVING CONDUCTIVE VIA

TECHNICAL FIELD

The present invention relates to a method for manufacturing a circuit board, and in particular, to a method for manufacturing a circuit board having a conductive via that is filled with an adequate amount of a conductive material to provide an electrical connection.

BACKGROUND OF THE INVENTION

Built-up, or multilayered, circuit boards having an insulating layer and a conductive circuit layer alternately laminated on a base substrate on the surface of which a conductive circuit is formed are known. For such circuit boards, generally, an opening (called a conductive via) is employed to establish an electrical connection between conductive circuits that are vertically separated by the insulating layer.

FIGS. 1A to 1D are diagrams showing a known process for manufacturing a conductive via. In FIG. 1A, a substrate 1 is prepared that has, as its upper surface, a conductive layer 3. A base 2 for substrate 1 is composed of either a single insulating layer or a multi-layer substrate, preferably prepared by laminating multiple insulating and conductive circuit layers. In FIG. 1B, an insulating layer 4 is formed on conductive layer 3 using a photosensitive resin. In FIG. 1C, common photolithography is employed to form an opening (a via) 5 in insulating layer 4. And then, in FIG. 1D, a plating method is used to form a conductive layer 6 across insulating layer 4 and inside opening 5 to provide a conductive via. With the conductive via, an electrical connection is established between conductive layer 3 at the bottom of opening 5 and conductive layer 6 on insulating layer 4 surrounding opening 5.

According to the method in FIGS. 1A to 1D, normally, the conductive layer inside the via is thinner than the conductive layer outside the via. This becomes especially pronounced as the diameter of the via is reduced and its depth is increased. This occurs because when a plating method is used, for example, as the diameter of the via is reduced and its depth increased, an insufficient quantity of plating liquid is supplied to the via. Therefore, according to the conventional manufacturing method in FIG. 1, the time required for the plating of conductive layer 6 is extended in order for a conductive layer having an adequate thickness to be deposited in the via.

However, when the time for plating conductive layer 6 is increased, the thickness of conductive layer 6 on insulating layer 4 surrounding the via is accordingly increased until it becomes thicker than necessary. Then, when an additional insulating layer and conductive circuit layer are laminated on conductive layer 6, the thicknesses of the layers around the via are increased, and a step is formed. As a result, a crack may occur in the conductive circuit layer in the multi-layer structure, and the circuit connection is broken. Therefore, a problem exists arising from the increase in the thickness of plated conductive layer 6 surrounding the via and the formation of a step.

FIGS. 2A to 2D are diagrams showing one known method for attempting to resolve this problem. In FIG. 2A, photoresist (hereinafter resist) 7 is applied to the substrate (FIG. 1D) on which conductive via 5 is formed using conductive layer 6. Since resist 7 has low viscosity and satisfactory flowability, it flows into and substantially fills via 5. Then, in FIG. 2B, resist 7 on conductive layer 6, excluding that in via 5, is removed by surface polishing, which exposes all the surface of conductive layer 6 except for that inside via 5. Subsequently, in FIG. 2C, the exposed conductive layer 6 is removed by etching, except for the portion inside via 5 that is still covered by resist 7. Finally, in FIG. 2D, after the remaining resist 7 has been removed from the via 5, a conductive layer 8 is plated on the surface of the substrate. Conductive layer 8 adequately covers conductive layer 6 in via 5, and a comparatively thin conductive layer 8 is deposited on the surface of insulating layer 4. As a result, the problem arising from the increase in the thickness of conductive layer 6 surrounding via 5 and the forming of the step is resolved.

However, according to the method in FIG. 2, since photosensitive resist 7 is removed by surface polishing, the following problems arise:

(a) Since the surface polishing tends to be non-uniformly performed, part of resist 7 remains on conductive layer 6, and that part of conductive layer 6 that is covered by the remaining resist 7 is not removed by the etching. Therefore, when conductive layer 8 is formed, differences in thicknesses (protrusion) occur in some places on conductive layer 6. That is, the resultant surface of conductive layer 8 is not even.

(b) When the surface polishing is incomplete and resist 7 remains on conductive layer 6, etching of conductive layer 6 is not complete, and so-called under etching appears. As a result, the thickness of conductive layer 8 on the surface of the substrate cannot be controlled and a predetermined thickness attained. Further, since the differences in thicknesses (protrusions) occur in some places on conductive layer 6, the surface of conductive layer 8 is not flat.

SUMMARY OF THE INVENTION

It is, therefore, one object of the invention to provide, without a surface polishing process having to be performed, a circuit board having a conductive via that is filled with an adequate amount of conductive material and that can satisfactorily conduct electricity.

It is another object of the invention to provide a method for controlling the thickness of a conductive layer on the surface of a substrate and to form a conductive circuit having a flat surface.

It is an additional object of the invention to provide a reliable circuit board that, by using a conductive circuit having a conductive via that is filled with a conductive material, also has a flat surface.

According to the present invention, a positive resist is used to adequately fill in even a relatively deep via having a relatively small diameter, and photolithography is used to selectively expose and develop a substrate in the perpendicular direction. A circuit substrate is formed having a flat surface and a conductive via, in which an adequate amount of conductive material is introduced to provide a sound electrical connection. The substrate is so formed without having to perform a conventional surface polishing process.

More specifically, according to the present invention, a method for manufacturing a circuit board having a conductive via comprises the steps of providing a substrate having a first surface and a first conductive layer on at least one region of the first surface, forming an insulating layer on the first conductive layer, forming an opening in the insulating layer, the opening extending to the first conductive layer, forming a second conductive layer inside the opening and at least on the insulating layer near the opening, applying a positive photoresist on the second conductive layer, exposing the positive photoresist, developing the exposed positive photoresist, and removing the positive photoresist on the second conductive layer, except a portion of the second conductive layer that is inside the opening, etching the second conductive layer, to expose a surface of the second conductive, removing the positive photoresist from inside the opening, and forming a third conductive layer inside the opening.

BEST MODE FOR CARRYING OUT THE INVENTION

Figure 1:
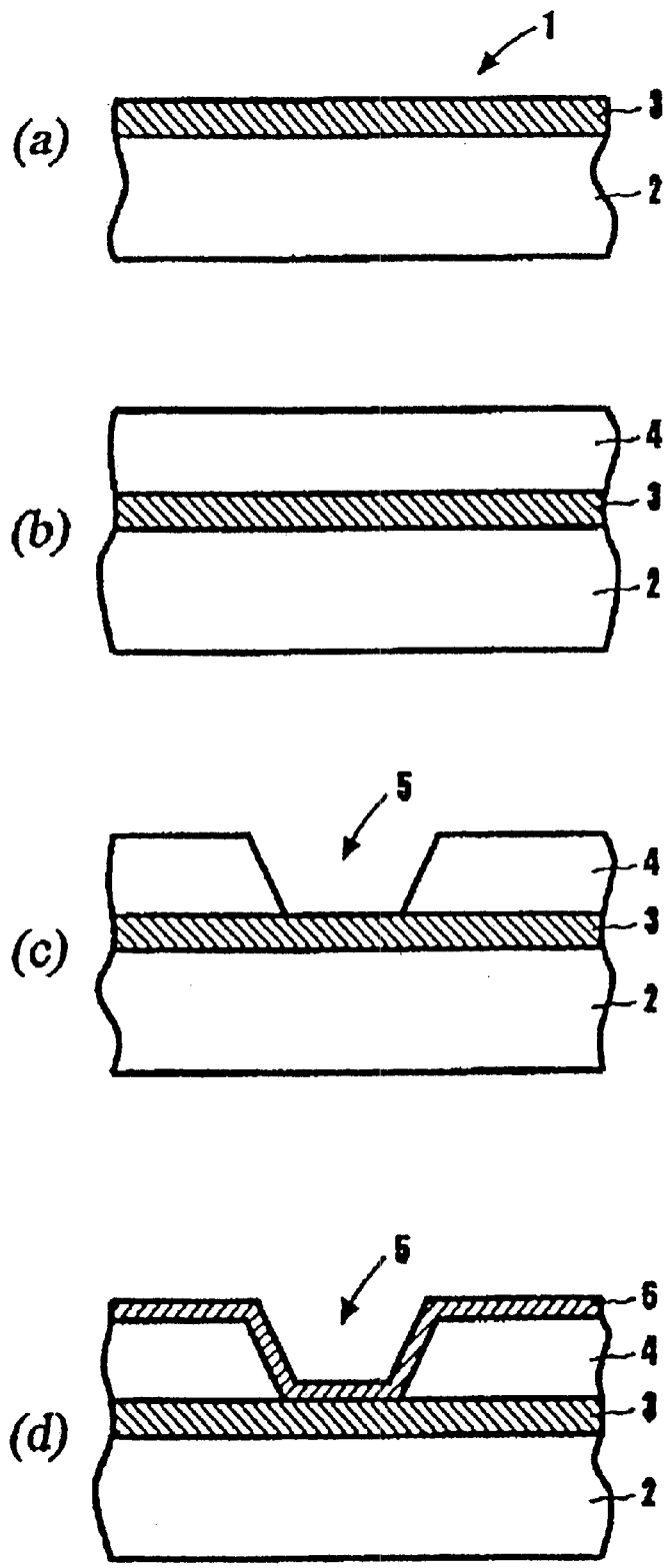
FIGS. 1A to 1D are diagrams showing a conventional process for manufacturing a conductive via.
Figure 2:
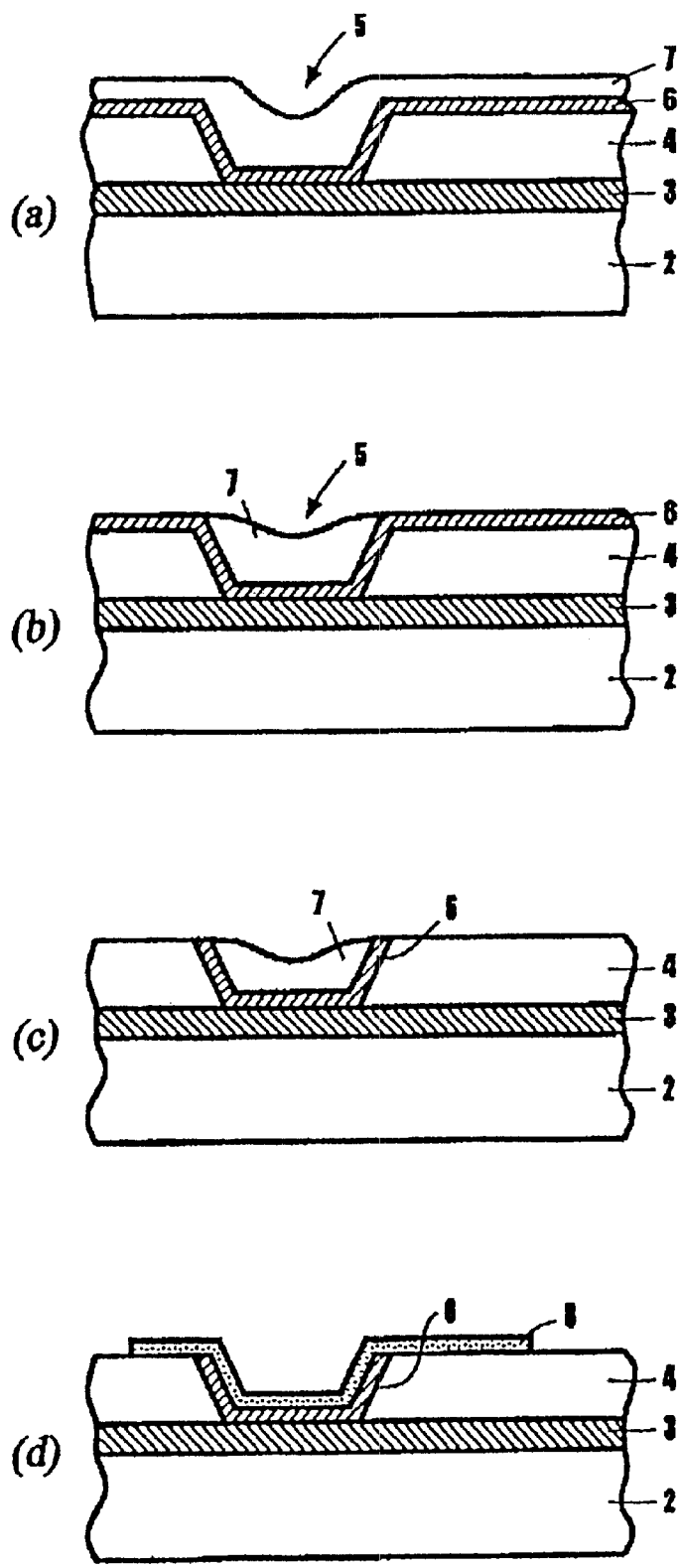
FIGS. 2A to 2D are diagrams showing added steps in a conventional process for manufacturing a conductive via.
Figure 3:
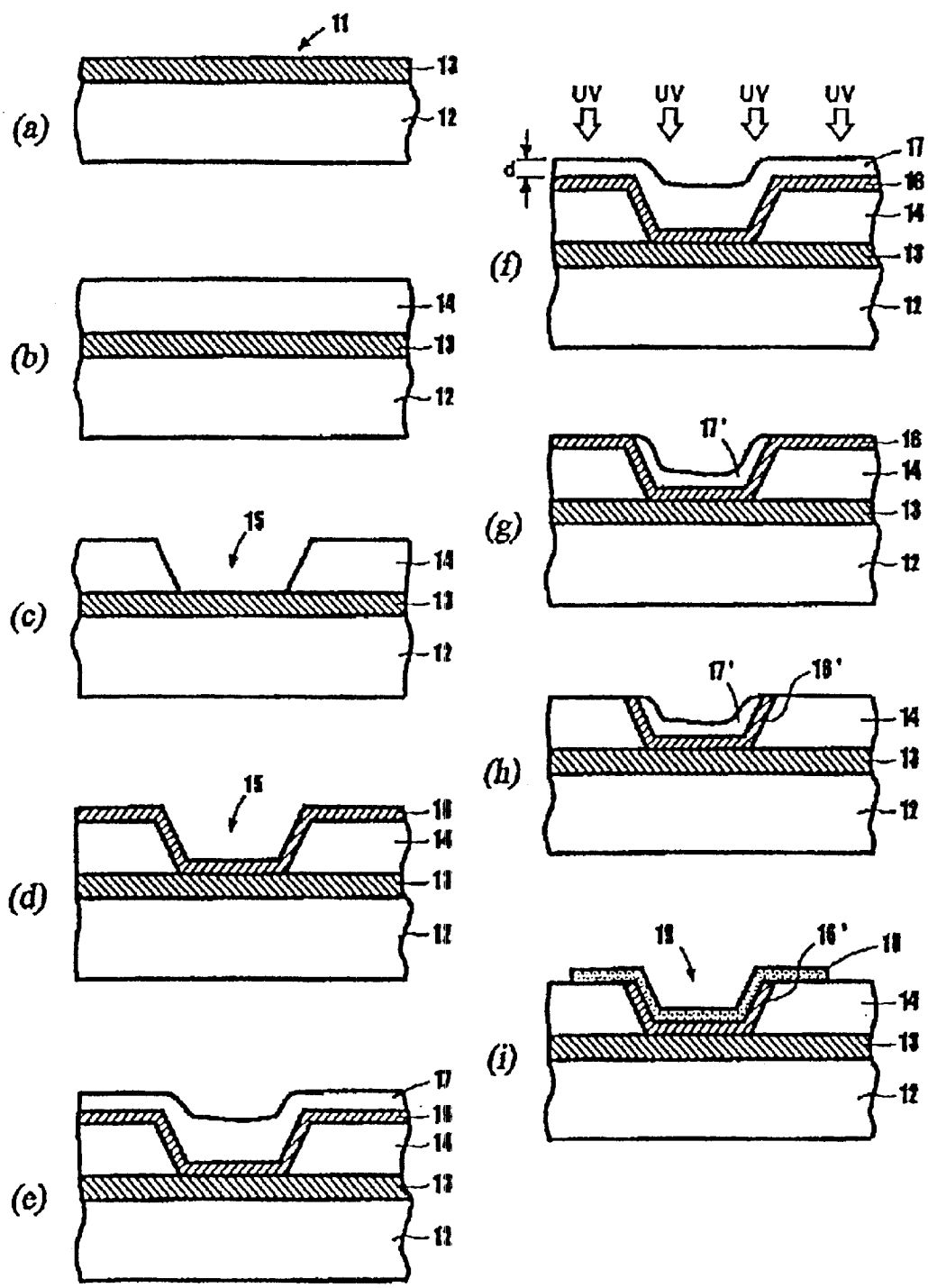
FIGS. 3A to 3I are diagrams showing a process for manufacturing a circuit board having a conductive via according to the present invention.

The preferred embodiment of the invention will now be described. FIGS. 3A to 3I are diagrams showing a method according to a preferred embodiment of the invention. In FIG. 3A, a substrate 11, one surface of which is a conductive layer 13, is prepared. A base 12 of substrate 11 may be either a single insulating layer formed of an epoxy resin, or a multi-layer circuit board prepared by alternately laminating one or more insulating layers and one or more conductive circuit layers. Conductive layer 13 may be a plated copper layer, or may be formed using a thin film deposition method, such as sputtering. In FIG. 3B, an insulating layer 14, composed of a photosetting or a thermosetting resin, is formed on conductive layer 13. In FIG. 3C, an opening (via) 15 is formed in insulating layer 14 using common photolithography, including known exposure and development processes. In one example, the depth of via 15 is from about 20 to 80 micrometers, and the diameter of via 15 is from about 30 to 100 micrometers.

In FIG. 3D, a conductive layer 16 is formed on insulating layer 14, including via 15. Electroless plating or electrolytic plating is employed as the method for forming the conductive layer 16, which is composed of copper, for example. With conductive layer 16, an electrical connection is established between conductive layer 13 and a conductive circuit (not shown), also located on insulating layer 14. Such a circuit is preferably a copper layer. In FIG. 3E, conductive layer 16 is coated with positive photosensitive resist 17, and is electrodeposited. A positive resist is employed because only the resist area exposed during in the following exposure and development process is removed. Further, an electrodeposited resist is employed because, since electrodeposition employs a reaction with acid (due to the electrolysis of water), the resist will satisfactorily fill even a deep via having a small diameter. According to the teachings herein, the deeper the via was and the smaller the diameter, the thicker was the electrodeposit resist that filled the via. One example of a positive resist that can be used is model P-2000 manufactured by Nippon Paint Co., Ltd., or the resist, model PEPR2400 manufactured by Shipley Co., Ltd. When a positive electrodeposited resist is employed, the thickness of the resist layer 17 may be, for example, about 40 micrometers inside the via and about seven micrometers on the adjacent surface of conductive layer 16.

In FIG. 3F, positive resist layer 17 is irradiated by ultraviolet (UV) light for resist exposure. A light-shielding mask is not required for the exposure. The exposure condition, such as the wavelength band of ultraviolet light, the strength of exposure or the exposure time, is selected in accordance with the type and the thickness of the positive resist that is employed. The importance of the invention is that the strength of the exposure (exposure time) is selected so that overall, the resist that is exposed has a thickness equivalent to the thickness "d" (FIG. 3F) of the resist 17 on the surface of conductive layer 16, excluding via 15. This is because only resist 17 on the surface of conductive layer 16, excluding via 15, is to be developed and removed. For example, when resist 17 is about seven micrometers thick on the surface of conductive layer 16, excluding via 15, overall, resist 17 that is exposed has a thickness of about seven micrometers. At this time, when a resist having a thickness of about 40 micrometers fills via 15, only the resist on the surface that has a thickness of about seven micrometers is exposed, and the remaining resist, which has a thickness of about 33 micrometers, is not exposed. It should be noted that the thickness of the resist that is exposed need not have an exact dimension "d". Only that resist which has a thickness of at least "d" must be exposed. No problem occurs when the resist is overexposed, when the thickness of the resist that is exposed is more than "d". This is because the thickness (e.g., about 40 micrometers) of resist 17 in via 15 is sufficiently greater than the thickness (e.g., about seven micrometers) of resist 17 on conductive layer 16, excluding via 15.

In FIG. 3G, exposed positive resist 17 is developed using a known method. Positive resist 17 that is removed by exposure, had a thickness equivalent to the thickness "d". As a result, a positive resist 17' remains in via 15, while the surface of conductive layer 16, excluding via 15, is exposed. According to the exposure and development method used for this invention, the resist layer on the surface of the substrate can be completely removed, without the conventional surface polishing being required. This is because the removal of the resist can be performed more accurately by exposure and development than by surface polishing. In FIG. 3H, using normal etching, conductive layer 16 that is not covered with positive resist 17', is removed from insulating layer 14, and thereafter, the remaining positive resist 17' is removed.

In FIG. 3I, after all positive resist 17' has been removed, conductive layer 18 is deposited on the surface of the substrate, including inside via 15. Electroless plating or electrolytic plating, for which copper, for example, is selected, is employed to form conductive layer 18. When conductive layer 18 is formed in the via, the previously deposited conductive layer 16' and conductive layer 18 are laminated, and a conductive via (stacked via) 19 is obtained. Since conductive via 19 is composed of conductive, adequately thick layers, a satisfactory electrical connection can be established. Further, since conductive layer 18 deposited on insulating layer 14 surrounding conductive via 19 has only a small, predetermined thickness, no step is formed due to an increase in the thicknesses of conductive layers surrounding via 19. Thereafter, conductive layer 18 is etched along a predetermined pattern using normal photolithographic processing. Thus, by performing the above processing, a circuit board having a conductive via is obtained. Furthermore, after conductive layer 18 has been formed in FIG. 3I, the processes in FIG. 3E to FIG. 3I may be repeated to obtain a conductive via in which more conductive layers are laminated.

According to the manufacturing method of this invention, since the resist layer is removed from the surface of the conductive layer, excluding the via, by photolithography instead of the conventional surface polishing, removal of the resist can be performed more accurately. As a result, the conductive layer can be completely etched from the surface of the substrate, excluding the via, and the occurrence of a step due to an increase in the thickness of the conductive layer surrounding the via can be prevented. Therefore, since the surface flatness is ensured, the manufacturing method of the invention is especially effective for a built-up, multilayered circuit board having one or more additional layers.

Also, according to the manufacturing method of this invention, it is possible to produce a circuit board having a conductive via that is filled with an adequate amount of conductive material and that provides a satisfactory electrical connection. And furthermore, again according to the manufacturing method of this invention, a reliable circuit board that experiences no electrical connection failures can be obtained by using a conductive circuit having a flat surface and a conductive via containing an adequate amount of conductive material.

While there have been shown and described what are at present the preferred embodiments of the invention, it will be obvious to those skilled in the art that various changes and modifications may be made therein without departing from the scope of the invention as defined by the appended claims.

What is claimed is:

1. A method for manufacturing a circuit board having a conductive via comprising the steps of:

providing a substrate having a first surface and a first conductive layer on at least one region of said first surface;

forming an insulating layer on said first conductive layer;

forming an opening in said insulating layer, said opening extending to said first conductive layer;

forming a second conductive layer inside said opening and at least on said insulating layer near said opening;

applying a positive photoresist on said second conductive layer;

exposing said positive photoresist;

developing said exposed positive photoresist, and removing said positive photoresist on said second conductive layer, except a portion of said second conductive layer that is inside said opening;

etching said second conductive layer, to said surface of said insulating layer near said opening;

removing said positive photoresist from inside said opening; and forming a third conductive layer inside said opening.

2. The manufacturing method according to claim 1, wherein said positive photoresist is electrodeposited.

3. The manufacturing method according to claim 1, wherein both said step of forming said second conductive layer and said step of forming said third conductive layer comprise a copper plating step.

4. The manufacturing method according to claim 1, wherein said step of exposing said positive photoresist includes a step of exposing the surface of said entire positive photoresist to a depth equivalent to the thickness of said positive photoresist, excluding the inside of said opening, on said second conductive layer.

5. The manufacturing method according to claim 1, further comprising a step of patterning said third conductive layer to form a circuit.

* * * * *